(12) United States Patent
Caulkins

(10) Patent No.: US 9,250,762 B2
(45) Date of Patent: Feb. 2, 2016

(54) GRAPHICS DETERMINISTIC PRE-CACHING

(71) Applicant: Jason Caulkins, Issaquah, WA (US)

(72) Inventor: Jason Caulkins, Issaquah, WA (US)

(73) Assignee: Dataram, Inc., Princeton, NJ (US)

( * ) Notice: Subject to any disclaimer, the term of this patent is extended or adjusted under 35 U.S.C. 154(b) by 154 days.

(21) Appl. No.: 14/188,304

(22) Filed: Feb. 24, 2014

(65) Prior Publication Data

US 2015/0242060 A1    Aug. 27, 2015

(51) Int. Cl.
- G06F 12/00 (2006.01)
- G06F 3/0481 (2013.01)
- G11C 7/10 (2006.01)
- G06F 9/44 (2006.01)
- G06F 9/38 (2006.01)

(52) U.S. Cl.
CPC ............ *G06F 3/0481* (2013.01); *G06F 9/3808* (2013.01); *G06F 9/441* (2013.01); *G11C 7/1075* (2013.01)

(58) Field of Classification Search
CPC ..... G06F 3/0481; G06F 9/441; G06F 9/3808; G11C 7/1075
See application file for complete search history.

*Primary Examiner* — Gurtej Bansal
(74) *Attorney, Agent, or Firm* — Donald R. Boys; Central Coast Patent Agency, Inc.

(57) ABSTRACT

An apparatus includes a computerized appliance having a processor, persistent storage storing one or more executable programs, and Dynamic Random Access Memory (DRAM) accessible by the processor, and caching software (SW) executing on the processor from a non-transitory medium, the SW providing a process: storing Logical Block Address (LBA) tables associated with individual ones of existing programs executable on the processor, tracking program launch and close, managing caching of data for any program launched according to the associated LBA, tracking data usage during execution of any program launched, on closing a program, removing any unused LBAs from the associated LBA table, adding any LBAs accessed not on the table; and saving the resulting LBA table for the program closed.

14 Claims, 6 Drawing Sheets

GUI setup and configuration

GRAPHICS DETERMINISTIC PRE-CACHING

BACKGROUND OF THE INVENTION

1. Field of the Invention

The present invention is in the field of general purpose computers, and pertains particularly to pre-caching data for specific applications to DRAM memory.

2. Description of Related Art

Computer systems typically have data storage systems from which data is read and to which data is written during program execution. Permanent storage is typically accomplished via a disk drive or other persistent media. Computers also typically have Dynamic Random Access Memory (DRAM), which is volatile memory, meaning that the contents are lost when power is switched off. It is well-known that read and write data access is generally slower with persistent media than with DRAM. Because of this, computers in the art often temporarily hold some data in DRAM for quicker access by the central processing unit (CPU). Loading this data prior to the time when it needs to be accessed is called pre-caching.

For optimal performance, computer programs and applications need to access most urgent and frequently used data as quickly as possible. The system will typically learn to cache, making that data more readily available. Still, the machine learning takes time, and does not always produce the optimum performance, especially in the case of certain applications which may need to contain large amounts of infrequently used data. Therefore, what is clearly needed is a method to enable the computer to configure DRAM to have a cache portion, and to cache data in a manner to optimize performance for data-intensive programs that are important, but are not necessarily cache-friendly.

BRIEF SUMMARY OF THE INVENTION

In one embodiment of the present invention an apparatus is provided, comprising a computerized appliance having a processor, persistent storage storing one or more executable programs, and Dynamic Random Access Memory (DRAM) accessible by the processor, and caching software (SW) executing on the processor from a non-transitory medium. The SW provides a process: storing Logical Block Address (LBA) tables associated with individual ones of existing programs executable on the processor, tracking program launch and close, managing caching of data for any program launched according to the associated LBA, tracking data usage during execution of any program launched, on closing a program, removing any unused LBAs from the associated LBA table, adding newly accessed LBAs not on the table, and saving the resulting LBA table for the program closed.

In one embodiment the caching SW provides a configuration utility including a graphical user interface (GUI), the SW on computer boot scans the persistent storage of the computer for executable programs and populates a list of discovered programs in the GUI, and the GUI enables a user to select programs, and to allocate DRAM space for cache for individual programs selected. Also in one embodiment, in the act of tracking program launch and close, the caching SW determines if a program launched is launched for the first time, and if so, in the act of tracking data usage the caching SW builds an LBA table associated with that program.

In one embodiment, barring reboot, the data indicated in the LBA table built remains in cache, and the LBA table is updated during subsequent program calls. Also in one embodiment the GUI comprises one or more links that, when initiated, open a browser application and assert a URL for a web site having resources for deterministic pre-caching. Still in one embodiment the one or more links enabling a user to download updated versions of the pre-caching SW, register downloaded SW, and to seek help with set-up and operation of the pre-caching SW. And still in one embodiment a user is enabled to download and use LBA tables pre-prepared for known executable programs.

In another aspect of the invention a method is provided, comprising steps: (a) storing Logical Block Address (LBA) tables associated with individual ones of existing programs executable on a processor of a computerized appliance having persistent storage and Dynamic Random Access Memory (DRAM) accessible by the processor; (b) tracking program launch and close; (c) managing caching of data for any program launched according to the associated LBA table; (d) tracking data usage during execution of any program launched; (e) on closing a program, removing any unused LBAs from the associated LBA table; and (f) saving the resulting LBA table for the program closed.

In one embodiment of the method there is a step providing a configuration utility including a graphical user interface (GUI), wherein the SW on computer boot scans the persistent storage of the computer for executable programs and populates a list of discovered programs in the GUI, and the GUI enables a user to select programs, and to allocate RAM space for cache for individual programs selected. Also in one embodiment, in the act of tracking program launch and close, the caching SW determines if a program launched is launched for the first time, and if so, in the act of tracking data usage the caching SW builds an LBA table associated with that program.

In one embodiment, barring reboot, the data indicated in the LBA table built remains in cache, and the LBA table is updated during subsequent program calls. Also in one embodiment the GUI comprises one or more links that, when initiated, open a browser application and assert a URL for a web site having resources for deterministic pre-caching. Still in one embodiment the one or more links enables a user to download updated versions of the pre-caching SW, register downloaded SW, and to seek help with set-up and operation of the pre-caching SW. Also in one embodiment a user is enabled to download and use LBA tables pre-prepared for known executable programs.

DETAILED DESCRIPTION OF THE INVENTION

Figure 1:
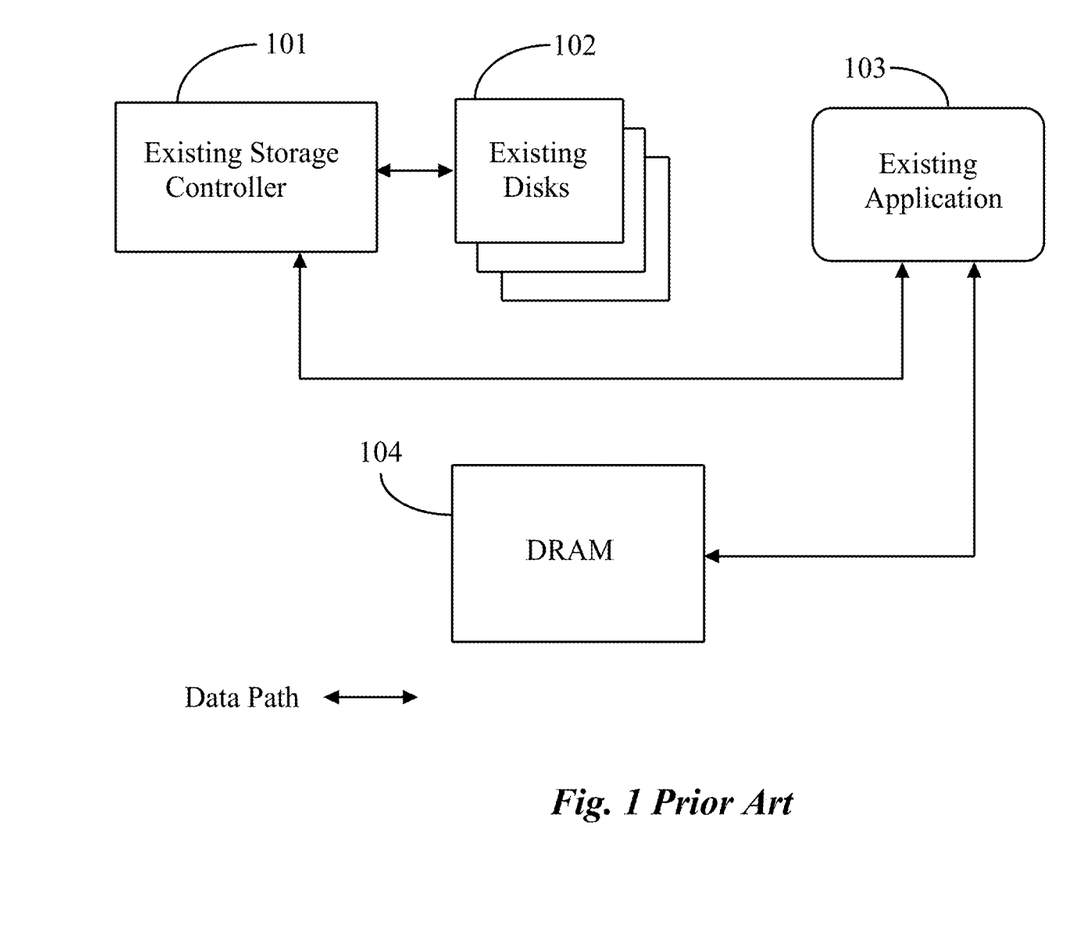
FIG. 1 is an architectural illustration of a typical prior art computer system showing data paths.

FIG. 1 is an architectural illustration of a typical prior art computer system showing data paths. In the prior art, application 103 executing on the CPU (not shown) of the computer receives data from disks 102 or other persistent storage through existing storage controller 101. Application 103 can also be served data from DRAM 104, if needed data is in fact stored in the DRAM. If the application is infrequently used and uses large amounts of data, typical DRAM will not make much difference in the storage performance of the application. The system will typically 'learn' to cache, making needed data more readily available. Still, the machine learning takes time, and does not always produce the optimum performance, especially in the case of certain applications which may need to use large amounts of infrequently-used data. In the existing art illustrated by FIG. 1 there is no facility for a user to select programs for pre-cache optimization.

Figure 2:
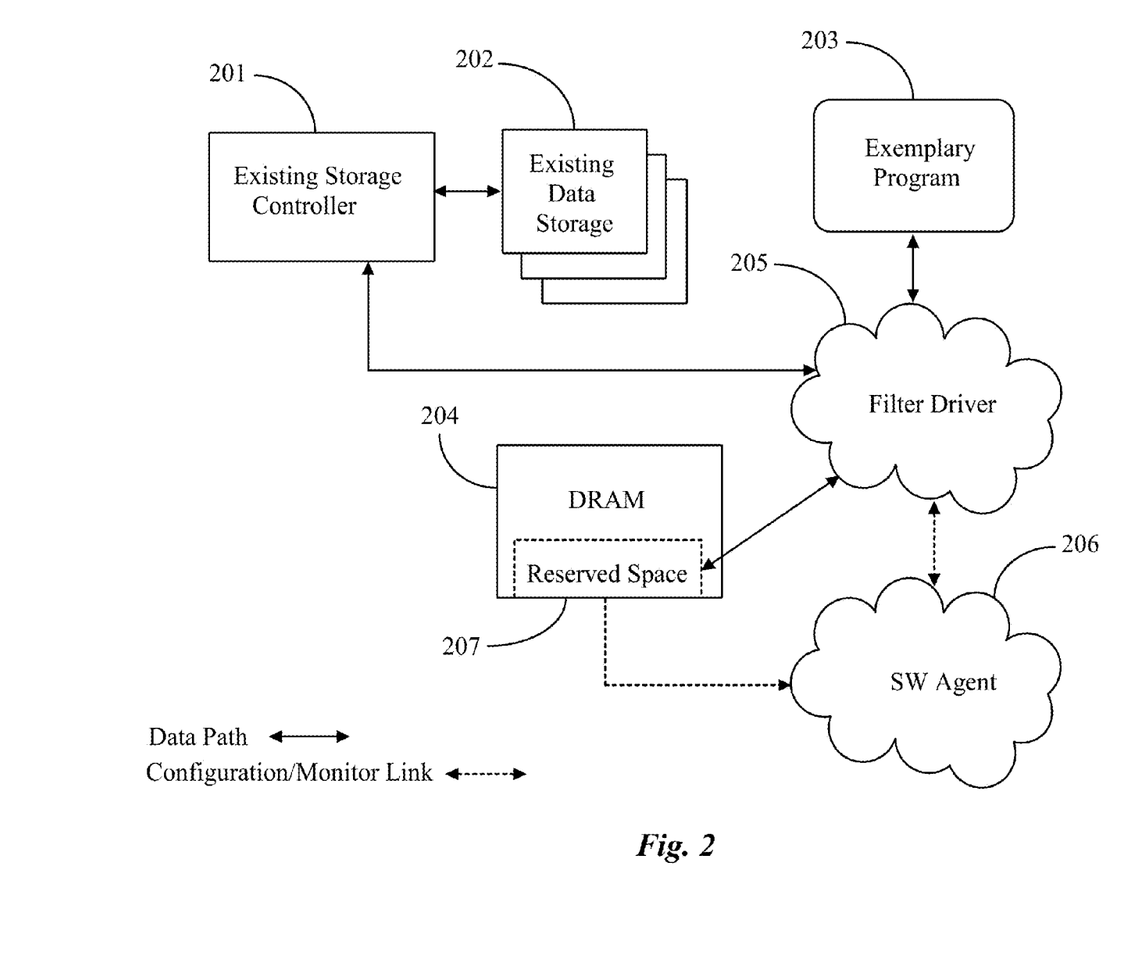
FIG. 2 is an architectural illustration of a computer system utilizing cache optimization according to an embodiment of the present invention.

FIG. 2 is an architectural illustration of a computer system utilizing deterministic pre-caching optimization according to an embodiment of the present invention to optimize performance of an example program 203 running on the computer CPU (not shown). In one embodiment a user obtains and installs deterministic pre-caching software (SW) which includes a filter driver 205 and a SW agent 206. The pre-caching SW may be downloaded from a website, or may be provided in another manner, such as on a portable memory device or disk.

Once installed, the pre-caching SW loads and runs in the background when the computer is booted. The first time the SW executes SW, Agent 206 initiates a scan of all persistent storage 202 coupled to the computer, through existing storage controller 201, to find executable application files. On completion of the scan SW Agent 206 populates and displays a list of the executable application files found in a GUI window as shown for example in FIG. 3. The GUI window is enabled with interactive indicia enabling the user to accomplish a number of objectives such as choosing applications to be optimized, selecting the priority of optimization of individual or groups of applications and selecting the amount of DRAM memory 207 to allocate as cache for individual or groups of applications.

Figure 3:
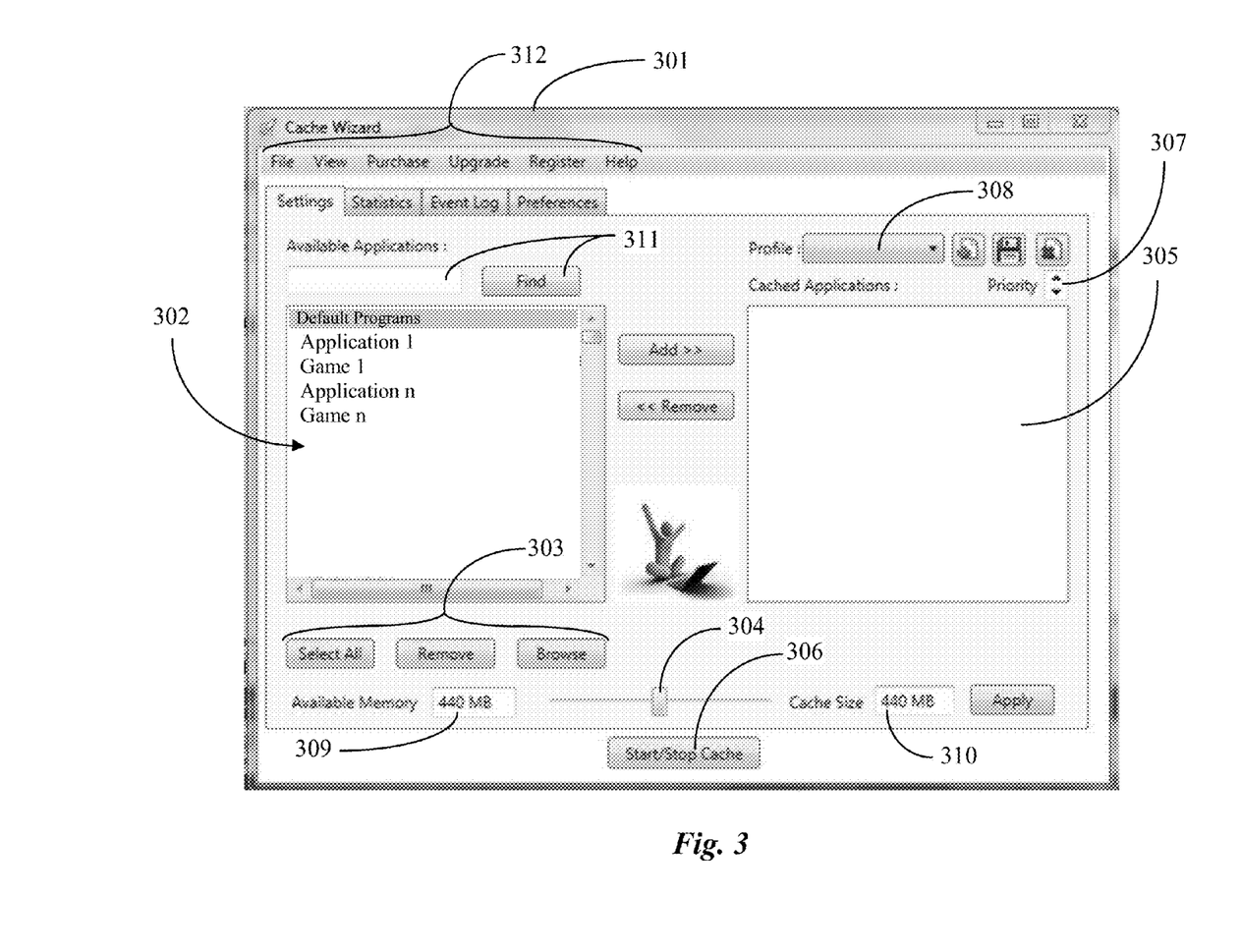
FIG. 3 is an exemplary screen shot of a Graphical User Interface according to an embodiment of the present invention.

FIG. 3 is an exemplary screen shot of a Graphical User Interface according to an embodiment of the invention. In using the deterministic pre-caching SW of an embodiment of the invention a graphical user interface 301 is provided. The user may search for an application for optimization with provided search window 311. The user may also browse for applications through the browse button in selector group 303. The selectors in group 303 also enable selecting all programs and removing programs prior to adding to window 305. In one embodiment the indicia include an available memory indicator 309, a cache size selector 304, a cache size indicator 310 and a start stop indicator 306.

As a result of the scan of persistent storage 202 a list of executable programs is rendered in window 302. These programs may be selected by the user and added to window 305 one at a time or in groups. Once added to window 305 the user may prioritize the programs by selecting a program and using arrow selector 307 to raise or lower the priority of the program. The priority of the programs may be made individually or in groups. The user has the ability to select the cache size in DRAM for particular programs or groups of programs via selector 304 which may be moved to the left or right, raising or lowering the amount of cache used for each program.

On first execution of one of the configured programs optimized by the user with interactive interface 301, filter driver 205 receives notice from Agent 206 that the application is launching. As the program operates, Filter driver 205 monitors data traffic and builds a table of Logical Block Addresses (LBAs) to cache for this program. The table of LBAs associated with this program is saved if the program is terminated, and the cached data for that program remains in cache in DRAM while the computer is in operation. If the same program is called again before the computer is shut down, in one embodiment of the invention the SW again tracks data usage, and if that usage differs significantly, the LBA table for that program may be updated.

When and if monitored applications are quit or the computer is shut down, LBA tables built and possibly refined during operation are saved for later use, and in the case of a reboot, any data cached in DRAM 204 disappears from the DRAM. At subsequent computer boot as programs are called and begin to execute, Filter Driver 205 manages data caching for the programs, enabling optimized performance of the programs.

Figure 4:
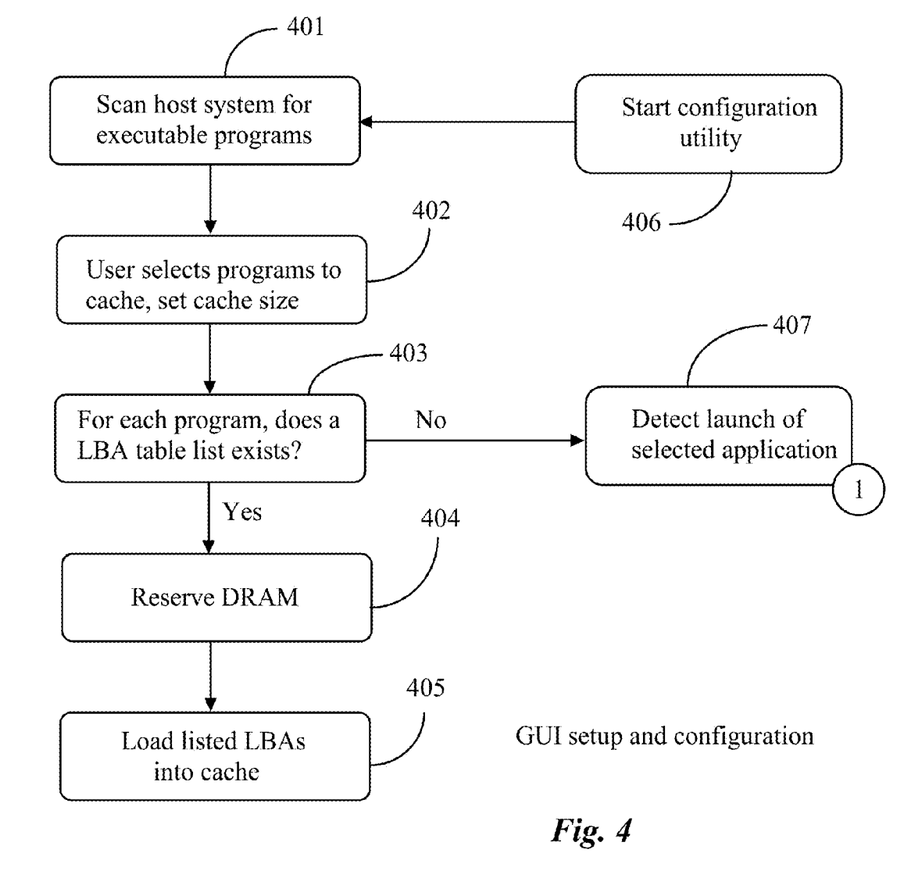
FIG. 4 is a process flow chart illustrating configuration of a computer for program optimization, using a GUI interface according to an embodiment of the present invention.

FIG. 4 is a process flow chart illustrating configuration and setup using the GUI interface of FIG. 3 according to an embodiment of the present invention. In one embodiment a configuration utility is initiated at step 406. Once the configuration utility is initiated the system initiates a scan of the host system at step 401 to find executable programs. The executable programs are listed in interface 302 of FIG. 3. At step 402 the user selects programs among the listed programs to cache and selects the cache size. The system determines in step 403 if a LBA table exists for the selected program. If so, then a portion of DRAM is reserved at step 404. At step 405 the data at the LBAs from the table are loaded into the reserved DRAM cache. If at step 403 it is determined that an LBA table does not exist, then control goes to step 407 to continue to look for launch of a selected application.

Figure 5:
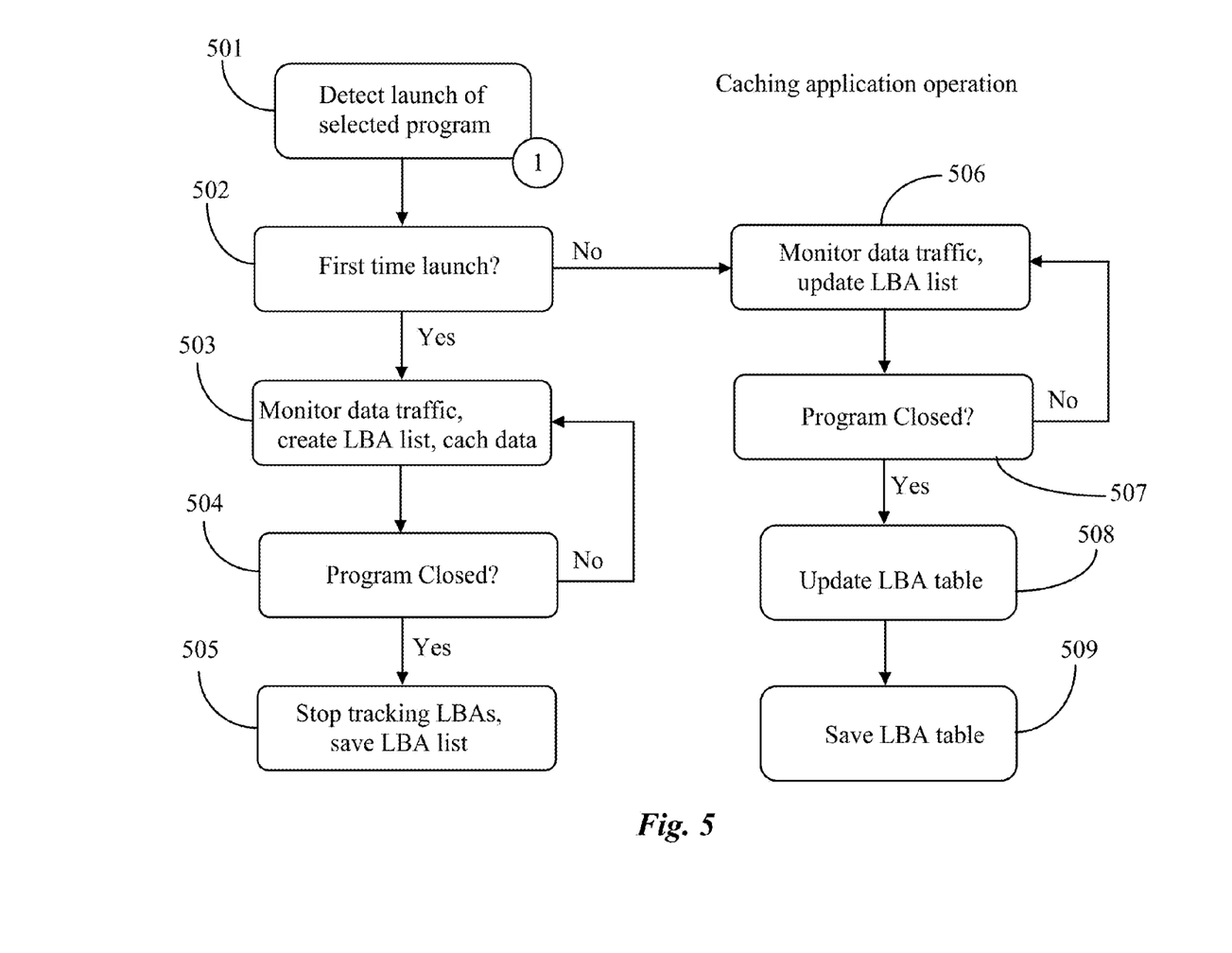
FIG. 5 is a process flow chart illustrating a caching application operation following launch of a program in an embodiment of the invention.

FIG. 5 is a process flow chart illustrating a caching operation according to an embodiment of the present invention, expanding from position (1) in FIG. 4, showing operation when a selected program is launched. In this embodiment, at step 501, a launch of the selected program is detected. At step 502 it is determined if the launch is a first launch. If at step 502 it is determined that the launch of the program is a first launch, then at step 503 the data traffic is monitored, cached, and an LBA table is created. At step 504 a determination is made as to whether the program has been closed or not. If the program is closed at step 504 then the LBA is saved at step 505. If it is determined that the application has not been closed at step 504 then step 503 continues to monitor LBA traffic for the closure of the application so that an LBA table may be created and data cached.

If at step 502, the launch of the program is not a first launch, the data traffic is monitored and the LBA table is updated at step 506. At step 507 a determination is made as to whether the application has been closed. If the application has been closed, then at step 508, unused addresses are removed from the LBA table and LBAs that were accessed that were not on the table are added to the table, then the LBA table is saved at step 509. If it is determined that the program has not been closed at step 507 the data traffic continues to be monitored at step 506 until the program is closed and the LBA table can be updated and saved at step 508 and 509.

Figure 6:
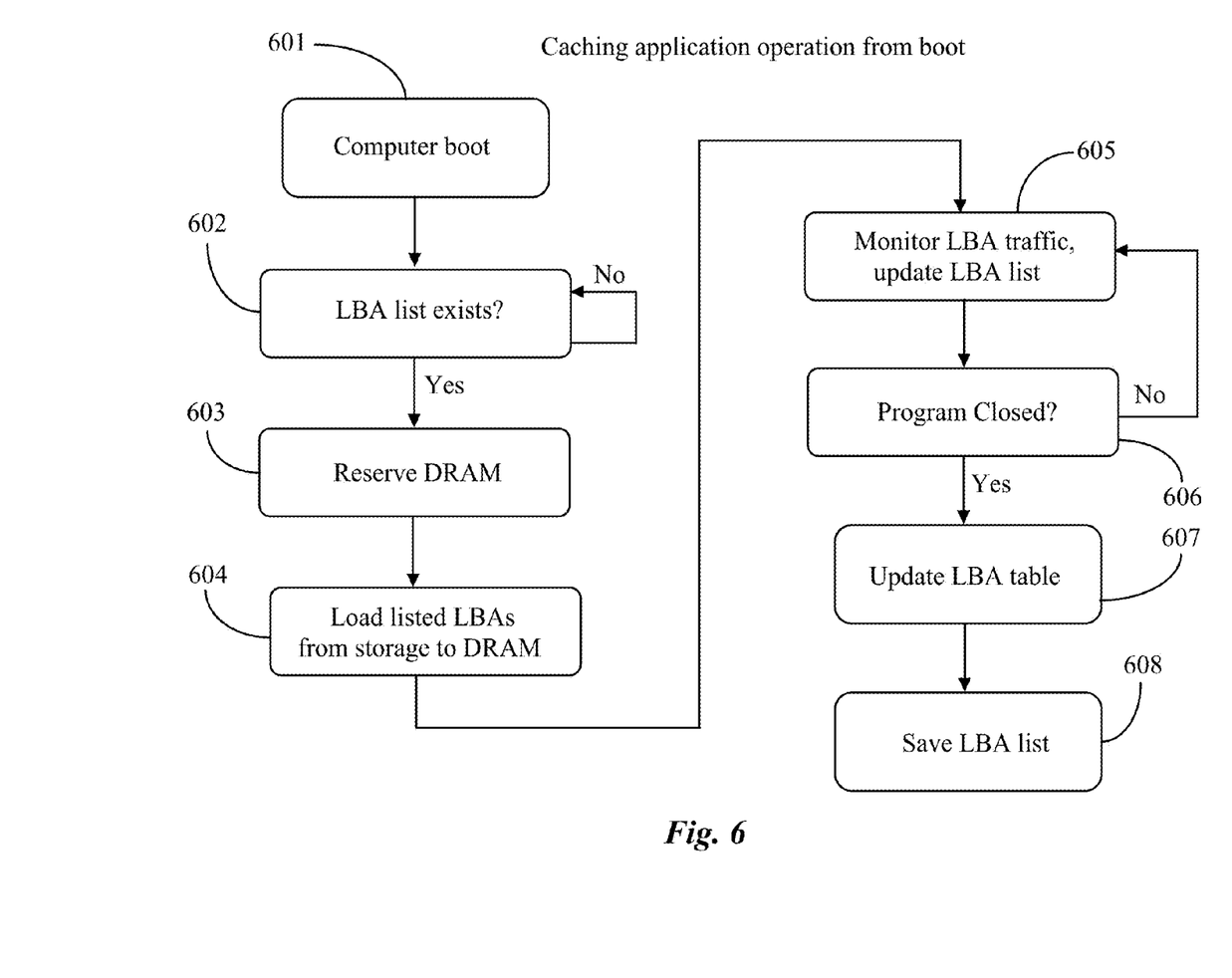
FIG. 6 is invention process flow chart illustrating a caching operation following computer boot in an embodiment of the present invention.

FIG. 6 is a process flow chart illustrating a caching operation from computer boot according to an embodiment of the present invention. At step 601, the computer is booted. Once the computer is booted a determination is made as to the existence of the LBA list previously created. If the LBA list is detected at step 602, DRAM is reserved at step 603. At step 604 the listed LBAs are loaded from storage to DRAM. At step 605 the data traffic is monitored and LBA lists are updated. If the program is closed at step 606 the unused LBAs are removed, LBAs not listed on the table are added, and the LBA table is updated. If the application is not closed at step 606 the data traffic continues to be monitored and updated until the application is closed and the LBA table is updated in step 607 and saved in step 608.

In one embodiment a profile may be selected via drop-down menu 308 (FIG. 3), which may contain an application or a group of applications that a user has previously set up for deterministic pre-caching. A user may have a profile for gaming, for example, whereby certain gaming applications are configured for deterministic pre-caching. Another user or the same user may have a pre-configured group of applications concerning graphics that he or she has pre-configured to use deterministic pre-caching software according to an embodiment of the present invention. In one embodiment the GUI may include a group of links 312 that enable the user to purchase software, upgrade software, register software or get help with software.

In one embodiment the pre-caching SW of the invention may run in the background with no need for user input. In another embodiment the configuration utility is pre-configured with common LBA profiles for applications such that little or no user input is needed. In this embodiment there may be a utility for noting the directory structure of a user's computer, and processing that structure to determine data storage characteristics enabling LBA lists pre-prepared for known programs to be downloaded and used without user input.

An internet-connected server may be provided comprising software executing from a non-transitory medium, and a range of functionality including, for example, downloading deterministic pre-caching SW according to embodiments of the present invention. This server also provides services that may be accessed via links 312. The software comprising a configuration utility executable on a CPU of a computing appliance, and a stored dB comprising information and files associated with programs, the information and files prepared to optimize performance of specific programs in caching operation. The server provides an interactive interface to a browser executing on an Internet connected computing appliance, the interactive interface enabling a user to download the SW, to be installed and executed on the CPU of the computing appliance, downloading configuration files to be installed on the computing appliance, partitioning a portion of system DRAM of the computing appliance as cache, and loading information and files from the storage media to the cache portion of system DRAM, optimizing performance of the programs installed on the computing appliance.

It will be apparent to a skilled person that the embodiments described in enabling detail above are exemplary only, and do not describe every way the present invention may be implemented and practiced. SW may be implemented in different ways in different circumstances to accomplish the same or very similar results. There are also many different ways that computer systems may be implemented that might use the SW according to embodiments of the present invention. The invention is limited only by the claims that follow.

The invention claimed is:

1. An apparatus, comprising:
a computerized appliance having a processor, persistent storage storing one or more executable programs, and Dynamic Random Access Memory (DRAM) accessible by the processor; and
caching software (SW) executing on the processor from a non-transitory medium, the SW providing a process:
storing Logical Block Address (LBA) tables associated with individual ones of existing programs executable on the processor;
tracking program launch and close;
managing caching of data for any program launched according to the associated LBA;
tracking data usage during execution of any program launched;
on closing a program, removing any unused LBAs from the associated LBA table, adding any LBAs accessed not on the table; and
saving the resulting LBA table for the program closed.

2. The apparatus of claim 1 wherein the caching software (SW) provides a configuration utility including a graphical user interface (GUI), the SW on computer boot scans the persistent storage of the computer for executable programs and populates a list of discovered programs in the GUI, and the GUI enables a user to select programs, and to allocate DRAM space for cache for individual programs selected.

3. The apparatus of claim 1 wherein, in the act of tracking program launch and close, the caching SW determines if a program launched is launched for the first time, and if so, in the act of tracking data usage the caching SW builds an LBA table associated with that program.

4. The apparatus of claim 3 wherein, barring reboot, the data indicated in the LBA table built remains in cache, and the LBA table is updated during subsequent program calls.

5. The apparatus of claim 3 wherein the GUI comprises one or more links that, when initiated, open a browser application and assert a URL for a web site having resources for deterministic pre-caching.

6. The apparatus of claim 5 wherein the one or more links enabling a user to download updated versions of the pre-caching SW, register downloaded SW, and to seek help with set-up and operation of the pre-caching SW.

7. The apparatus of claim 6 wherein a user is enabled to download and use LBA tables pre-prepared for known executable programs.

8. A method, comprising steps:
(a) storing Logical Block Address (LBA) tables associated with individual ones of existing programs executable on a processor of a computerized appliance having persistent storage and Random Access Memory (RAM) accessible by the processor;
(b) tracking program launch and close;
(c) managing caching of data for any program launched according to the associated LBA table;
(d) tracking data usage during execution of any program launched;
(e) on closing a program, removing any unused LBAs from the associated LBA table, adding any LBAs accessed not on the table; and
(f) saving the resulting LBA table for the program closed.

9. The method of claim 8 comprising a step for providing a configuration utility including a graphical user interface (GUI), wherein the SW on computer boot scans the persistent storage of the computer for executable programs and populates a list of discovered programs in the GUI, and the GUI enables a user to select programs, and to allocate DRAM space for cache for individual programs selected.

10. The method of claim 8 wherein, in the act of tracking program launch and close, the caching SW determines if a program launched is launched for the first time, and if so, in the act of tracking data usage the caching SW builds an LBA table associated with that program.

11. The method of claim 10 wherein, barring reboot, the data indicated in the LBA table built remains in cache, and the LBA table is updated during subsequent program calls.

12. The method of claim 10 wherein the GUI comprises one or more links that, when initiated, open a browser application and assert a URL for a web site having resources for deterministic pre-caching.

13. The method of claim 12 wherein the one or more links enabling a user to download updated versions of the pre-caching SW, register downloaded SW, and to seek help with set-up and operation of the pre-caching SW.

14. The method of claim 13 wherein a user is enabled to download and use LBA tables pre-prepared for known executable programs.

* * * * *